(12) United States Patent
Bryant (10) Patent No.: US 12,250,005 B2
(45) Date of Patent: Mar. 11, 2025

(54) ERROR CORRECTION SYSTEMS AND METHODS

(71) Applicant: Microsoft Technology Licensing, LLC, Redmond, WA (US)

(72) Inventor: Gregory Alan Bryant, Raleigh, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 18/336,697

(22) Filed: Jun. 16, 2023

(65) Prior Publication Data

US 2024/0421833 A1    Dec. 19, 2024

(51) Int. Cl.
*H03M 13/15* (2006.01)
*G06F 7/523* (2006.01)
*H03M 13/29* (2006.01)

(52) U.S. Cl.
CPC ........ *H03M 13/1575* (2013.01); *G06F 7/523* (2013.01); *H03M 13/2942* (2013.01)

(58) Field of Classification Search
None
See application file for complete search history.

(56) References Cited

U.S. PATENT DOCUMENTS

| 10,936,408 B2 | 3/2021 | Wu | |
| 2014/0089768 A1* | 3/2014 | Fujiwara | H03M 13/1545 714/781 |
| 2019/0042357 A1* | 2/2019 | Wu | G06F 11/1028 |
| 2023/0076545 A1* | 3/2023 | Kim | G06F 11/106 |
| 2023/0141583 A1* | 5/2023 | Ji | G06F 3/0653 711/156 |

FOREIGN PATENT DOCUMENTS

WO    2017048474 A1    3/2017

OTHER PUBLICATIONS

Choi, et al., "A Decoder for Short BCH Codes With High Decoding Efficiency and Low Power for Emerging Memories", IEEE Transactions On Very Large Scale Integration (VLSI) Systems, vol. 27, No. 2, Feb. 2019, pp. 387-397.
Garlapati, et al., "A Low Power Hard Decision Decoder for BCH Codes", International Conference On Advances In Computing And Communications (ICACC), IEEE, 2021, 6 pages.
International Search Report and Written Opinion received for PCT Application No. PCT/US2024/033325, mailed on Sep. 24, 2024, 15 pages.

\* cited by examiner

*Primary Examiner* — Guerrier Merant
(74) *Attorney, Agent, or Firm* — Holzer Patel Drennan (57) ABSTRACT

Embodiments of the present disclosure include techniques for error correction. Multiple successive odd syndromes are generated from input data comprising parity bits. Coefficients are generated and applied to a finite element field to detect multiple bit errors. Error correction circuitry corrects detected error bits. A single bit error detector may detect single bit errors. The error correction circuit may select between a single bit error vector and a multibit error vector based on one of the coefficients. The circuitry may be implemented in combinational logic to perform detection and correction in a single clock cycle.

20 Claims, 5 Drawing Sheets

ERROR CORRECTION SYSTEMS AND METHODS

BACKGROUND

The present disclosure relates to error correction.

Digital data represents information as zeros and ones. When digital data is stored in a memory or transmitted over a communication medium, it is possible for particular bits to experience errors. A zero may become a one, or a one may become a zero. When this happens, the information is corrupted and errors may occur across the system (e.g., software execution errors, data errors, or a variety of other system failures).

Traditional techniques for error correction encode one or more parity bits in the data being stored or transmitted. When the data is received, the parity bits are used to determine if any of the data bits have experienced an error, and if so, the parity bits can correct the error. Typical multibit error correction implementations require multiple clock cycles to detect and correct the errors.

The following disclosure includes improved techniques for addressing these and other issues.

DETAILED DESCRIPTION

Described herein are techniques for error correction. In the following description, for purposes of explanation, numerous examples and specific details are set forth in order to provide a thorough understanding of some embodiments. Various embodiments as defined by the claims may include some or all of the features in these examples alone or in combination with other features described below and may further include modifications and equivalents of the features and concepts described herein.

Figure 1:
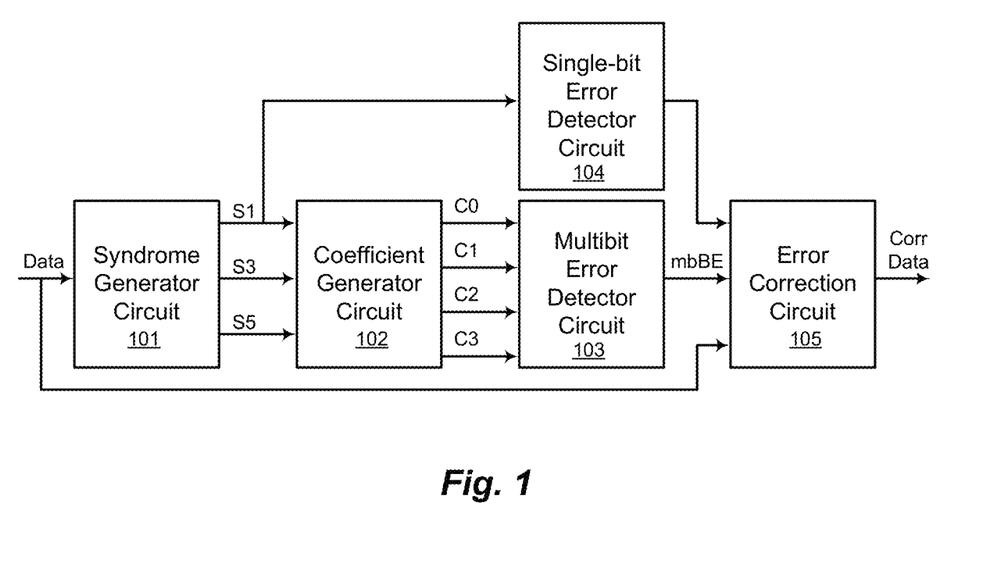
FIG. 1 illustrates an example electronic circuit for correcting data errors according to an embodiment.

FIG. 1 illustrates an example electronic circuit for correcting data errors according to an embodiment. Embodiments of the present disclosure include an electronic circuit for detecting and correcting errors in received data. Data may be received from a variety of sources, such as a memory (e.g., RAM, hard drive, solid state memory, etc.) or a communication medium (e.g., a transmission line, wireless channel, etc.). The data comprises a plurality of data bits and a plurality of parity bits. A syndrome generator 101 receives the data and generates a plurality of syndromes. Syndromes are multibit patterns that may be used to detect errors. Syndromes may comprise unique patterns that may be combined to determine the location of an error or that the data is error free. Features and advantages of the present disclosure include generating a plurality of successive odd syndromes. Successive odd syndromes, such as S1, S3, and S5 in FIG. 1, may be generated from a multibit finite element field (e.g., a Galois field comprising a plurality of alpha values, $\alpha_i$). For example, a finite element field may be generated using a field generator polynomial (e.g., $x^7+x^3+1$) to generate a plurality of multibit alpha values. Elements of a finite element field used to generate successive odd syndromes may be referred to as alpha values. Each successive odd syndrome, Sn, is generated from a plurality of alpha values in a finite element field. For example, each bit of the successive odd syndromes may be generated by XORing corresponding bit positions of every odd alpha value. For example:

$$S1[0]=\alpha_0[0]+\alpha_1[0]+\ldots+\alpha_{n-1}[0],\ldots,S1[N]=\alpha_0[N]+\alpha_1[N]+\ldots+\alpha_{n-1}[N]$$

$$S3[0]=\alpha_0[0]+\alpha_3[0]+\ldots+\alpha_{n3(n-1)}[0],\ldots,S3[N]=\alpha_0[N]+\alpha_3[N]+\ldots+\alpha_{n3(n-1)}[N]$$

$$S5[0]=\alpha_0[0]+\alpha_5[0]+\ldots+\alpha_{n5(n-1)}[0],\ldots,S5[N]=\alpha_0[N]+\alpha_5[N]+\ldots+\alpha_{5(n-1)}[N]$$

Accordingly, a first syndrome, S1, may be generated by XORing ("+" above) corresponding bit positions of elements of the field ($\alpha_0, \alpha_1, \alpha_2, \ldots \alpha_{n-1}$). A second syndrome, S3, may be generated from XORing corresponding bit positions of every third alpha value ($\alpha_0, \alpha_3, \alpha_6, \ldots \alpha_{3(n-1)}$), and a third syndrome, S5, may be generated by XORing corresponding bit positions of every fifth alpha value ($\alpha_0, \alpha_5, \alpha_{10}, \ldots \alpha_{5(n-1)}$). In one example embodiment described in more detail below, the syndrome is a 7 bit value configured to detect and correct 0-3 errors in data having between 45-106 bits or protected data, including parity bits, between 66-127 bits.

Successive odd syndromes are coupled to a coefficient generator circuit 102, which is configured to receive the plurality of successive odd syndromes and combine the syndromes to produce a plurality of coefficients, C0, C1, C2, C3, for example. Coefficients may be combinations of successive odd syndromes configured such that when applied to multibit digital values (alpha values) of the finite element field, errors (if any) may be detected. For example, the coefficients may be input to a multibit error detection circuit 103 configured to receive the coefficients. Circuit 103 is configured to apply the coefficients to the plurality of digital values and generate a multibit bit error vector, mbBE. The bit error vector may be a plurality of bit values equal to the number of data bits output from the error corrector.

For N bits of data to be corrected, a finite element field may use an M term polynomial code generator (e.g., where M is less than N, the exponentiated terms are bit positions having a value of 1 and the other terms are 0; successive values of the field are generated by successively adding elements with modulo "m" multiplication, where "m" is the number of elements in the field). The following code generator polynomial is one example polynomial that may be used:

$$G(x)=x^{21}+x^{18}+x^{17}+x^{15}+x^{14}+x^{12}+x^{11}+x^{8}+x^{7}+x^{6}+x^{5}+x^{1}+1$$

The above equation generates parity values and may be derived from the field generator polynomial (e.g., $x^7+x^3+1$) used to generate a plurality of multibit alpha values, for example.

In one embodiment, the bit error vector may have a value of one (e.g., logic high) in a bit position where the error is located. Accordingly, mbBE is coupled to an error correction circuit 105. Error correction circuit 105 is configured to combine the bit error vector with the data (e.g., including parity bits). The bit error vector is combined with the data to correct one or more bit errors in the data and produce corrected data (e.g., without parity bits). In various embodiments, the plurality of coefficients, excluding one coefficient, may be successively combined with an Nth power of each digital value. For example, C1-C3 may be applied, separately, to alpha values from the finite element field raised to the power of 0, 1 . . . . N−1 and added together and to C0 (e.g., $C3\alpha^0+C2\alpha^0+C1\alpha^0+C0$). If the result of any one of the sums is zero, then an error exists at that bit location, which may be compared to 0 and produce a value of 1 in the bit error vector, for example.

Embodiments of the present disclosure may include a single bit error detector circuit 104 to detect single bit errors. When a single bit error occurs, a multi-bit error locator may not be able to detect the error. To compensate for this case, an alternative single bit detector 104 is provided. This hardware compares each element of the finite field with the S1 syndrome from the syndrome generator. If $\alpha^i$ equals S1, then bit i is an error. These comparisons may be done in parallel with coefficient generator and multibit error detector to producing a single bit error vector, sbeCorr. If there are no bit errors, then S1=0 and no finite field elements will match, resulting in an sbeCorr vector of all 0s.

Advantageously, the syndrome generator circuit 101, the coefficient generator circuit 102, the multibit error detector 103, the single bit error detector 104, and the error correction circuit 105 may correct one or more bit errors in the data in a single clock cycle. For example, circuits 101-105 may be combinational logic circuits. Logic circuits may be implemented to calculate the syndromes and coefficients, and perform a parallel search of all possible solutions is used to find the errors in a single clock cycle. A pipelined implementation of circuit 101-105 may advantageously provide a single-cycle throughput with a 2 cycle latency, for example.

Figure 2:
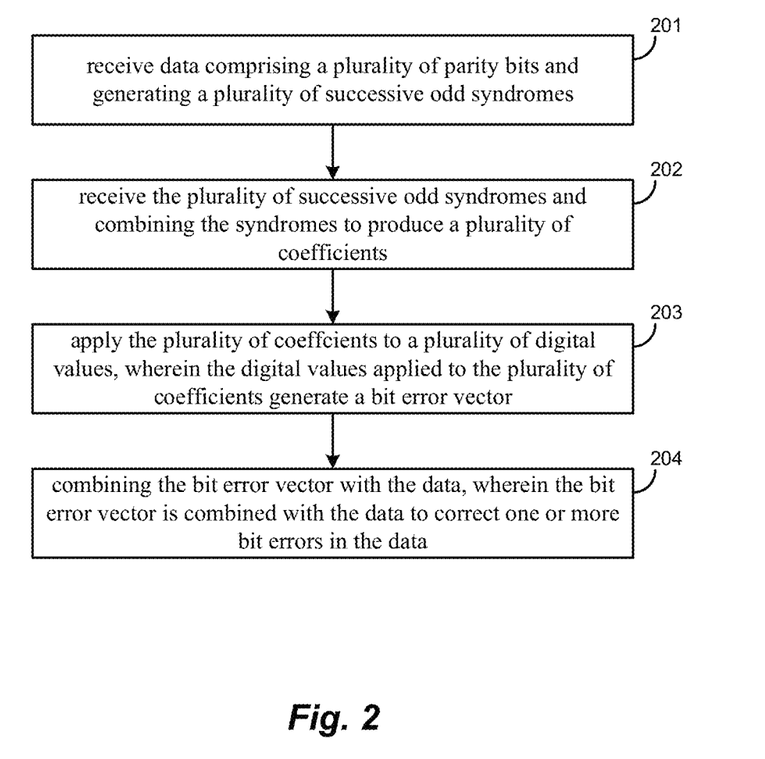
FIG. 2 illustrates an example method of correcting data errors according to an embodiment.

FIG. 2 illustrates a method of correcting bit errors according to an embodiment. At 201, data is received comprising a plurality of parity bits, and a plurality of successive odd syndromes are generated. At 202, the plurality of successive odd syndromes are combined to produce a plurality of coefficients. At 203, the plurality of coefficients are applied to a plurality of digital values, wherein the digital values applied to the plurality of coefficients generate a bit error vector. The bit error vector is combined with the data at 204, wherein the bit error vector is combined with the data to correct one or more bit errors in the data.

Figure 3:
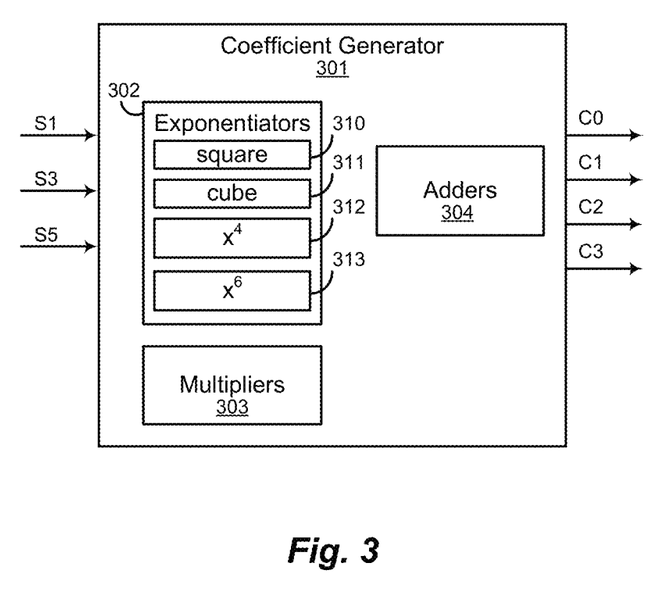
FIG. 3 illustrates an example coefficient generator according to an embodiment.

FIG. 3 illustrates an example coefficient generator according to an embodiment. In some embodiments, the coefficient generator circuit 301 comprises exponentiator circuits 302, multiplier circuits 303, and adder circuits 304. Exponentiator circuits 302 are configured to exponentiate at least a portion of the syndromes to produce a plurality of exponentiated syndromes ($S_i^n$). In some embodiments, exponentiator circuit comprises a square circuit 310 ($S_i^2$), cube circuit 311 ($S_i^3$), fourth power circuit 312 ($S_i^4$), and sixth power circuit 313 ($S_i^6$). Coefficient generator circuit 301 further includes multiplier circuits 303 configured to multiply syndromes ($S_i*S_j$). Further, coefficient generator circuit 301 includes adder circuits 304 configured to add one or more of the syndromes, the exponentiated syndromes, and the multiplied syndromes together to produce the plurality of coefficients. The coefficient generator may implement these arithmetic blocks using finite field arithmetic, for example.

EXAMPLE

In one embodiment, present disclosure includes an error detection and correction circuit as illustrated in FIG. 1. One example usage would be to use a code generator to attach 21 protection bits to a data word of 45 to 106 bits. This protected data could be written to a memory or transmitted over some potentially lossy medium. The protected data with up to 3 bit errors would go through the detection/correction circuits, which would restore the original data word.

In this example, a generator for a systematic BCH code includes a parity generation matrix with elements generated by the BCH code generator polynomial:

$$G(x)=x^{21}+x^{18}+x^{17}+x^{15}+x^{14}+x^{12}+x^{11}+x^8+x^7+x^6+x^5+x^1+1 \qquad \text{Eq. 1}$$

As illustrated in FIG. 1, an error detection/correction circuit includes Syndrome Calculation, Coefficient Calculation, Multi-bit Error location, Single-bit Error location, and Correction. The Multi-Bit path (Syndrome, Coefficient, Multi-Bit Locator) determines error locations for 2 and 3 bit errors by calculating the coefficients for and finding the solutions to the equation:

$$(S_1^3+S_3)x^3+(S_1S_3+S_1^4)x^2+(S_5+S_1^2S_3)x+S_1^3S_3+S_3^2+S_1^6+S_1S_5=0 \qquad \text{Eq. 2}$$

The Syndrome calculator calculates 3 successive odd syndromes based on the protected data, $S_1$, $S_3$, and $S_5$. Each is calculated by a parity matrix using a subset of the elements of the finite field (aka, Galois Field) GF ($2^7$) using the following field generator polynomial:

$$x^7+x^3+1 \qquad \text{Eq. 3}$$

There are N columns in each matrix, where N is the number of bits in the protected data. Specifically, the $S_1$ matrix is constructed of each sequential element of the field, $\alpha_0, \alpha_1, \alpha_2, \ldots \alpha_{n-1}$, the $S_3$ matrix is constructed of every $3^{rd}$ element of the field, $\alpha_0, \alpha_3, \alpha_6, \ldots \alpha_{3(n-1)}$, and the $S_5$ matrix is constructed of every $5^{th}$ element of the field, $\alpha_0, \alpha_5, \alpha_{10}, \ldots \alpha_{5(n-1)}$. It is to be understood that $\alpha_0$ is $\alpha$ to the zeroth power, $\alpha_1$ is $\alpha$ to the first power, . . . , and $\alpha_{n-1}$ is $\alpha$ to the $(n-1)^{st}$ power, and accordingly may be written as $\alpha^0 \ldots \alpha^{n-1}$, where $\alpha$ is $x^3+1$ (i.e., 0001001) in this example. As mentioned above, the bits of each syndrome are obtained by combining the corresponding bit positions of the alpha values using an XOR operation.

The Coefficient Calculator calculates the coefficients in Eq. 2. These coefficients are:

$$C_0=S_1^3S_3+S_3^2+S_1^6+S_1S_5 \qquad \text{Eq. 4}$$

$$C_1=S_5+S_1^2S_3 \qquad \text{Eq. 3}$$

$$C_2=S_1S_3+S_1^4 \qquad \text{Eq. 6}$$

$$C_3=S_1^3+S_3 \qquad \text{Eq. 7}$$

Note that the arithmetic in the Coefficient Calculation is performed in the finite field GF ($2^7$) using the polynomial specified in Eq. 3.

Figure 4:
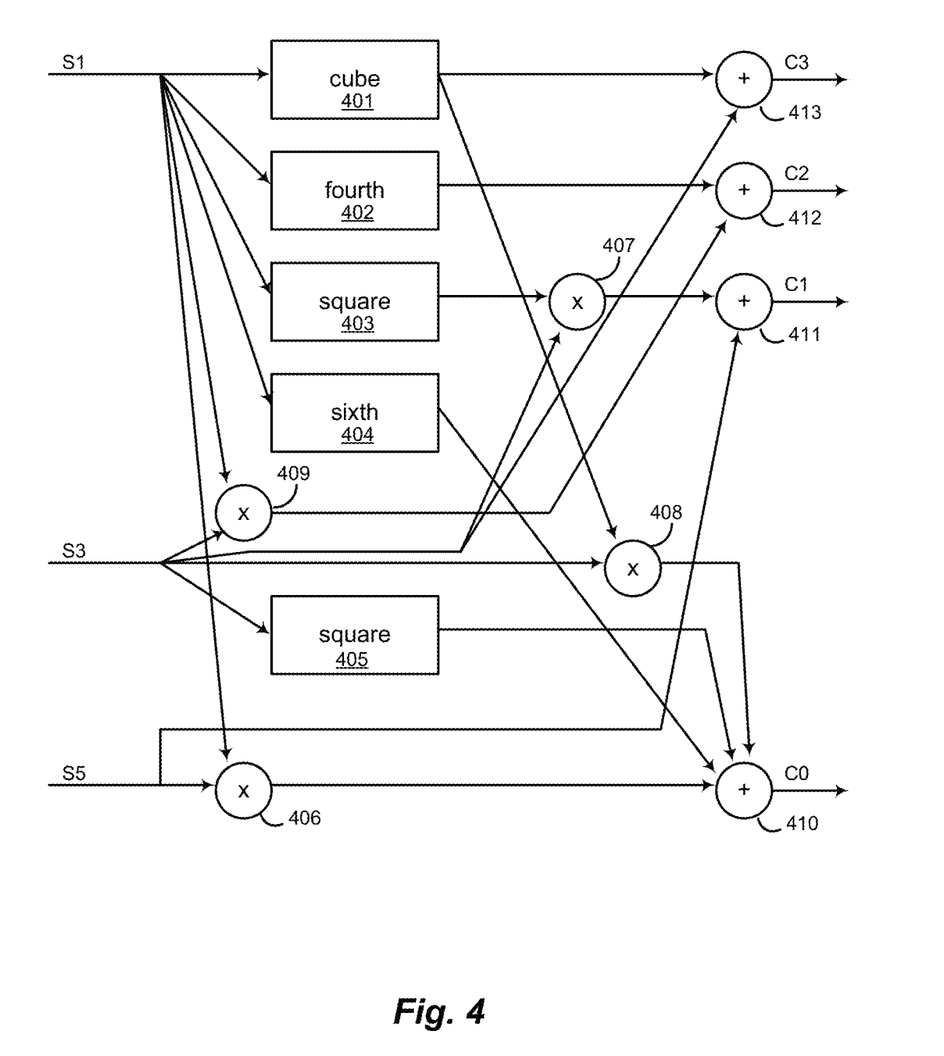
FIG. 4 illustrates an example implementation of coefficient generator according to an embodiment.

FIG. 4 illustrates an example implementation of coefficient generator according to an embodiment. Combinational logic functions may be written to perform the GF ($2^7$) Square, Cube, Fourth, Sixth, and multiplication operations. GF ($2^7$) addition is simple bit-wise XOR. As illustrated in FIG. 4, C3 is the sum of S1 cubed at 401 and S3 at the output of adder 413. C2 is the sum of S1 to the fourth power at 402 and the produce of S1 and S3 in multiplier 409 at the output of adder 412. C1 is the sum of S5 and the product of S3 and S2 squared (at 407 and 403, respectively, at the output of adder 411. C0 combines all syndromes at the output of adder 410. A first input of adder 410 is coupled to an output of multiplier 406 that multiplies S1 and S5. A second input of adder 410 is S1 to the sixth power at 404. A third input of adder 410 is the square of S3 at 405. S1 is cubed at 401 and then multiplied by S3 at 408 to produce the fourth input to adder 410.

Figure 5:
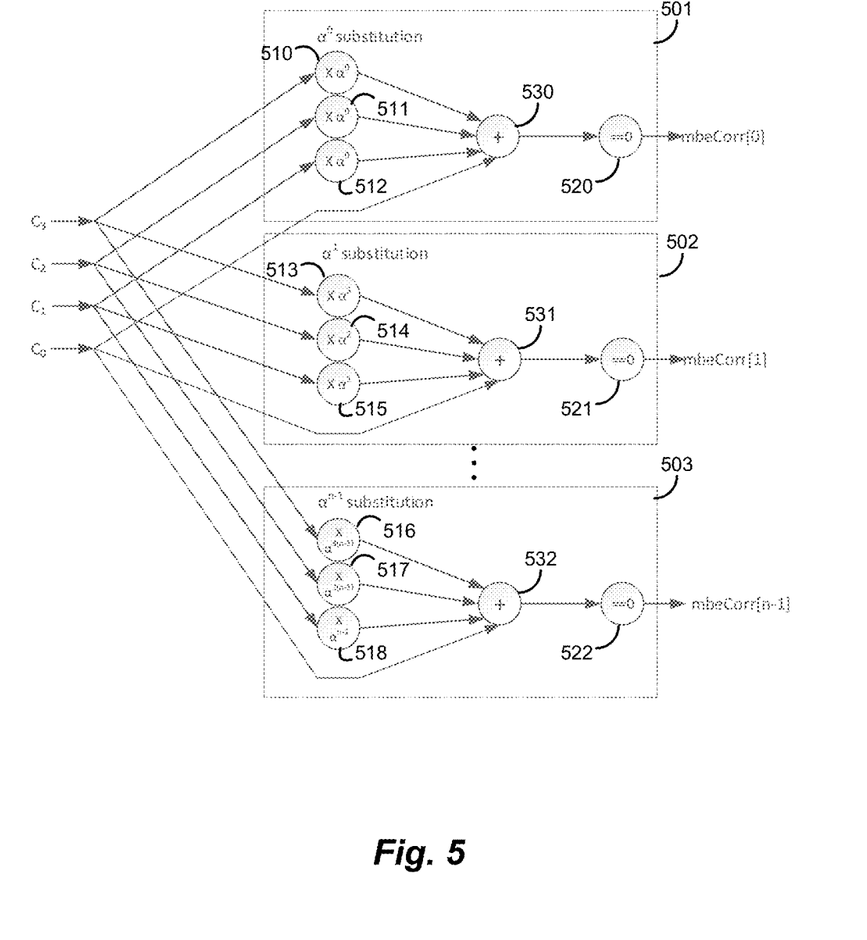
FIG. 5 illustrates an example multibit error correction circuit according to an embodiment.

FIG. 5 illustrates an example multibit error correction circuit according to an embodiment. Two or three bit errors can be located by finding the solutions in the finite field to Eq. 2 above. When the syndromes(S) are applied to the field values (x) (e.g., alpha values) generated by Eq. 3, a result of zero (aka, a solution to eq. 2) indicates an error at the bit location corresponding to the particular field value producing the zero value. In other words, if $\alpha^i$ is a solution, then bit i is an error and should be inverted in the data. In this example, if there is only 1 bit error, then all coefficients are 0, and the error location may be found using the single-bit error detector.

The solutions are found using parallel substitution, implemented in the circuit of FIG. 5. For each bit in the protected data, logic is provided to evaluate Eq. 2 for its corresponding power of $\alpha$. The substitutions that evaluate to 0 will set a bit in the mbeCorr bit error vector. This bit error vector is used to correct bit errors in the correction circuit. As illustrated in FIG. 5, coefficients, excluding C0, are successively combined with an Nth power of each digital value in multiply-addition circuits 501-503. Coefficients C1-C3 are combined in multipliers 510-512 with a $0^{th}$ power of $\alpha$ and added to C0 in adder 530, and then the result is compared to zero in comparator 520 to produce a $0^{th}$ element of mbBECorr. Coefficients C1-C3 are separately combined in multipliers 513-518 with $1^{st}, 2^{nd} \ldots (n-1)^{th}$ powers of $\alpha$ and added to C0 in adders 531-532, and the result is compared to zero in comparator 521-522 to produce a $0^{th}$ element of mbBECorr. Arithmetic in the multibit error circuit is in the same GF ($2^7$) finite field.

Figure 6:
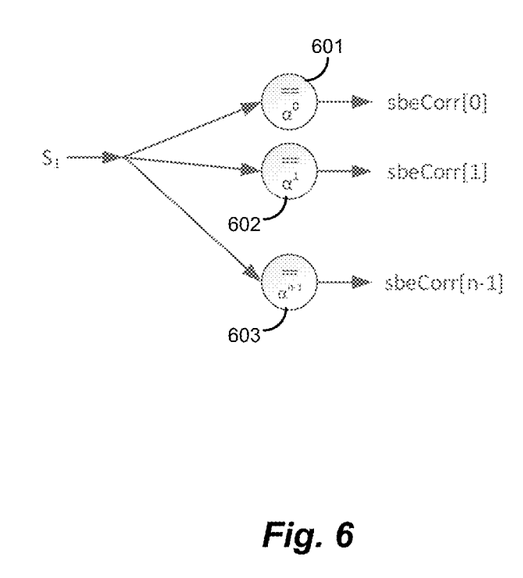
FIG. 6 illustrates an example single bit error correction circuit according to an embodiment.

FIG. 6 illustrates an example single bit error correction circuit according to an embodiment. In this example, when a single bit error occurs, the multi-bit error locator fails. To compensate for this case, an alternative single bit error detector is provided. This hardware compares each element of the finite field with the S1 syndrome from the syndrome generator circuit using comparator logic 601-603. If $\alpha^i$ equals $S_1$, then bit i is an error. These comparisons are done in parallel much like the multibit error detector, producing an sbeCorr vector. If there are no bit errors, then $S_1=0$ and no finite field elements will match, resulting in an sbeCorr bit error vector of all 0s.

Figure 7:
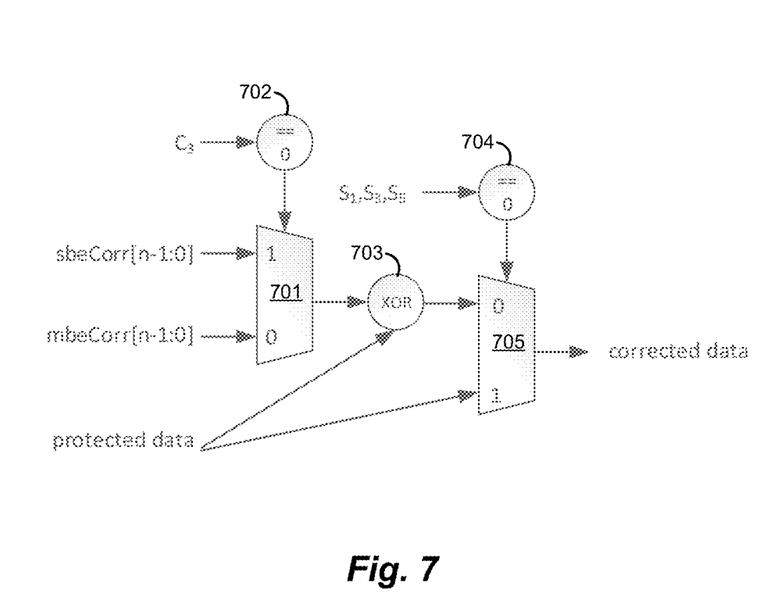
FIG. 7 illustrates an example error correction circuit according to an embodiment.

FIG. 7 illustrates an example error correction circuit according to an embodiment. If all of the syndromes are 0, no correction is needed and the comparator logic 704 passes through the raw protected data in multiplexor 705. Otherwise, the correction logic must choose between the two correction vectors and XOR the result with the protected data, resulting in the corrected data output. If there is a single bit error or no error, the coefficient $C_3$ will be 0, and comparator logic 702 causes multiplexer 701 to pass the sbeCorr bit error vector to the input of XOR logic 703. Otherwise, comparator logic 702 causes multiplexer 701 to pass the mbeCorr bit error vector to the input of XOR logic 703.

For some implementations (e.g., using high-speed clocks), the above example can be pipelined, continuing to provide a single-cycle throughput with a 2 cycle latency, for example.

FURTHER EXAMPLES

Each of the following non-limiting features in the following examples may stand on its own or may be combined in various permutations or combinations with one or more of the other features in the examples below. In various embodiments, the present disclosure may be implemented as a system or method.

In one embodiment, the present disclosure includes an electronic circuit for correcting data errors comprising: a syndrome generator to receive data comprising a plurality of parity bits and generate a plurality of successive odd syndromes; a coefficient generator, configured to receive the plurality of successive odd syndromes and combine the syndromes to produce a plurality of coefficients; a multibit error detector configured to receive the coefficients, wherein the coefficients are applied to a plurality of digital values, wherein the digital values applied to the plurality of coefficients generates a first bit error vector; and an error correction circuit configured to combine the first bit error vector with the data, wherein the first bit error vector is combined with the data to correct one or more bit errors in the data.

In another embodiment, the present disclosure includes a method of correcting data errors comprising: receiving data comprising a plurality of parity bits and generating a plurality of successive odd syndromes; receiving the plurality of successive odd syndromes and combining the syndromes to produce a plurality of coefficients; applying the plurality of coefficients to a plurality of digital values, wherein the digital values applied to the plurality of coefficients generate a first bit error vector; and combining the first bit error vector with the data, wherein the first bit error vector is combined with the data to correct one or more bit errors in the data.

In one embodiment, the electronic circuit further comprises a single bit error detector configured to receive a first syndrome of the plurality of successive odd syndromes and produce a second bit error vector, wherein the error correction circuit combines the second bit error vector with the data to correct one bit error in the data.

In one embodiment, one of the plurality of coefficients selects between the first bit error vector and the second bit error vector in the error correction circuit.

In one embodiment, each successive odd syndrome is generated from a plurality of alpha values in a finite element field produced using a field generator polynomial.

In one embodiment, wherein each bit of the successive odd syndromes is generated by XORing corresponding bit positions of every Nth alpha value, where N is an odd integer.

In one embodiment, wherein the plurality of syndromes comprise: a first syndrome comprising a plurality of bits generated from XORing corresponding bit positions of the plurality of every alpha value, a second syndrome comprising a plurality of bits generated from XORing corresponding bit positions of every third alpha value, and a third syndrome comprising a plurality of bits generated from XORing corresponding bit positions of every fifth alpha value.

In one embodiment, the data comprises N bits, and wherein the digital values are N binary alpha values.

In one embodiment, the N binary alpha values are elements of a finite element field generated from a field generator polynomial.

In one embodiment, the plurality of coefficients, excluding one coefficient, is successively combined with an Nth power of each digital value.

In one embodiment, the coefficient generator comprises: a plurality of exponentiator circuits configured to exponentiate at least a portion of the syndromes to produce a plurality of exponentiated syndromes; a plurality of multiplier circuits configured to multiply at least a portion of the syndromes;

and a plurality of adder circuits configured to add one or more of the syndromes, the exponentiated syndromes, and the multiplied syndromes together to produce the plurality of coefficients.

In one embodiment, the exponentiator circuits comprise a square generator circuit, a cube generator circuit, a fourth generator circuit, and a sixth generator circuit.

In one embodiment, the plurality of successive odd syndromes comprise: a first syndrome produced from adding same bit positions of a plurality of elements of a finite element field; a second syndrome produced from adding same bit position of every third element of said elements; and a third syndrome produced from adding same bit positions of every fifth element of said elements, wherein the first syndrome is coupled to the exponentiator circuits to produces a first syndrome squared, a first syndrome cubed, a first syndrome to a fourth power, and a first syndrome to a sixth power, wherein the second syndrome is coupled to the exponentiator circuits to produce a second syndrome squared, wherein the first syndrome and second syndrome are coupled to a first multiplier of the plurality of multiplier circuits to produce a first multiplied syndrome, wherein the first syndrome and third syndrome are coupled to a second multiplier of the plurality of multiplier circuits to produce a second multiplied syndrome, wherein the second syndrome and first syndrome cubed are coupled to a third multiplier of the plurality of multiplier circuits to produce a third multiplied syndrome, wherein the second syndrome and the first syndrome squared are coupled to a fourth multiplier of the plurality of multiplier circuits to produce a fourth multiplied syndrome, and wherein the second multiplied syndrome, the first syndrome to the sixth power, the second syndrome squared, and the third multiplied syndrome are coupled to a first adder of the plurality of adder circuits to produce a first coefficient of the plurality of coefficients, wherein the third syndrome and the fourth multiplied syndrome are coupled to a second adder of the plurality of adder circuits to produce a second coefficient of the plurality of coefficients, wherein the first multiplied syndrome and the first syndrome to the fourth power are coupled to third adder of the plurality of adder circuits to produce a third coefficient of the plurality of coefficients, and wherein the second syndrome and the first syndrome cubed are coupled to fourth adder of the plurality of adder circuits to produce a fourth coefficient of the plurality of coefficients.

In one embodiment, the syndrome generator, the coefficient generator, the multibit error detector, and the error correction circuit correct one or more bit errors in the data in a single clock cycle.

In one embodiment, the syndrome generator, the coefficient generator, the multibit error detector, and the error correction circuit correct are combinational logic circuits.

In one embodiment, the method further comprising producing a single bit error vector based on a first syndrome, and combining the single bit error vector with the data to correct a one bit error in the data when one of the plurality of coefficients indicates a single bit error.

In one embodiment, producing a plurality of coefficients comprises: exponentiating at least a portion of the syndromes to produce a plurality of exponentiated syndromes; multiplying at least a portion of the syndromes; and adding one or more of the syndromes, the exponentiated syndromes, and the multiplied syndromes together to produce the plurality of coefficients.

In one embodiment, exponentiating at least a portion of the syndromes generate a square, a cube, a fourth power, and a sixth power of one or more syndromes.

In one embodiment, generating the plurality of successive odd syndromes, producing the plurality of coefficients, generating the first bit error vector, and correcting the one or more bit errors in the data are performed in a single clock cycle using combinational logic circuits.

The above description illustrates various embodiments along with examples of how aspects of some embodiments may be implemented. The above examples and embodiments should not be deemed to be the only embodiments, and are presented to illustrate the flexibility and advantages of some embodiments as defined by the following claims. Based on the above disclosure and the following claims, other arrangements, embodiments, implementations and equivalents may be employed without departing from the scope hereof as defined by the claims.

What is claimed is:

1. An electronic circuit for correcting data errors comprising:
   a syndrome generator to receive data comprising a plurality of parity bits and generate a plurality of successive odd syndromes;
   a coefficient generator, configured to receive the plurality of successive odd syndromes and combine the syndromes to produce a plurality of coefficients;
   a multibit error detector configured to receive the coefficients, wherein the coefficients are applied to a plurality of digital values, wherein the digital values applied to the plurality of coefficients generates a first bit error vector;
   an error correction circuit configured to combine the first bit error vector with the data, wherein the first bit error vector is combined with the data to correct one or more bit errors in the data
   a single bit error detector configured to receive a first syndrome of the plurality of successive odd syndromes and produce a second bit error vector, wherein the error correction circuit combines the second bit error vector with the data to correct one bit error in the data; and
   the error correction circuit configured to combine the first bit error vector with the data, wherein the first bit error vector is combined with the data to correct one or more bit errors in the data, wherein one of the plurality of coefficients selects between the first bit error vector and the second bit error vector in the error correction circuit.

2. The electronic circuit of claim 1, wherein each successive odd syndrome is generated from a plurality of alpha values in a finite element field produced using a field generator polynomial.

3. The electronic circuit of claim 2, wherein each bit of the successive odd syndromes is generated by XORing corresponding bit positions of every Nth alpha value, where N is an odd integer.

4. The electronic circuit of claim 2, wherein the plurality of syndromes comprise:
   a first syndrome comprising a plurality of bits generated from XORing corresponding bit positions of the plurality of every alpha value,
   a second syndrome comprising a plurality of bits generated from XORing corresponding bit positions of every third alpha value, and
   a third syndrome comprising a plurality of bits generated from XORing corresponding bit positions of every fifth alpha value.

5. The electronic circuit of claim 1, wherein the data comprises N bits, and wherein the digital values are N binary alpha values.

6. The electronic circuit of claim 5, wherein the N binary alpha values are elements of a finite element field generated from a field generator polynomial.

7. The electronic circuit of claim 1, wherein the plurality of coefficients, excluding one coefficient, is successively combined with an Nth power of each digital value.

8. The electronic circuit of claim 1, wherein the coefficient generator comprises:
a plurality of exponentiator circuits configured to exponentiate at least a portion of the syndromes to produce a plurality of exponentiated syndromes;
a plurality of multiplier circuits configured to multiply at least a portion of the syndromes; and
a plurality of adder circuits configured to add one or more of the syndromes, the exponentiated syndromes, and the multiplied syndromes together to produce the plurality of coefficients.

9. The electronic circuit of claim 8, wherein:
the exponentiator circuits comprise a square generator circuit, a cube generator circuit, a fourth generator circuit, and a sixth generator circuit.

10. The electronic circuit of claim 9, wherein the plurality of successive odd syndromes comprise:
a first syndrome produced from adding same bit positions of a plurality of elements of a finite element field;
a second syndrome produced from adding same bit position of every third element of said elements; and
a third syndrome produced from adding same bit positions of every fifth element of said elements,
wherein the first syndrome is coupled to the exponentiator circuits to produces a first syndrome squared, a first syndrome cubed, a first syndrome to a fourth power, and a first syndrome to a sixth power,
wherein the second syndrome is coupled to the exponentiator circuits to produce a second syndrome squared,
wherein the first syndrome and second syndrome are coupled to a first multiplier of the plurality of multiplier circuits to produce a first multiplied syndrome,
wherein the first syndrome and third syndrome are coupled to a second multiplier of the plurality of multiplier circuits to produce a second multiplied syndrome,
wherein the second syndrome and first syndrome cubed are coupled to a third multiplier of the plurality of multiplier circuits to produce a third multiplied syndrome,
wherein the second syndrome and the first syndrome squared are coupled to a fourth multiplier of the plurality of multiplier circuits to produce a fourth multiplied syndrome, and
wherein the second multiplied syndrome, the first syndrome to the sixth power, the second syndrome squared, and the third multiplied syndrome are coupled to a first adder of the plurality of adder circuits to produce a first coefficient of the plurality of coefficients,
wherein the third syndrome and the fourth multiplied syndrome are coupled to a second adder of the plurality of adder circuits to produce a second coefficient of the plurality of coefficients,
wherein the first multiplied syndrome and the first syndrome to the fourth power are coupled to third adder of the plurality of adder circuits to produce a third coefficient of the plurality of coefficients, and
wherein the second syndrome and the first syndrome cubed are coupled to fourth adder of the plurality of adder circuits to produce a fourth coefficient of the plurality of coefficients.

11. The electronic circuit of claim 1, wherein the syndrome generator, the coefficient generator, the multibit error detector, and the error correction circuit correct one or more bit errors in the data in a single clock cycle.

12. The electronic circuit of claim 11, wherein the syndrome generator, the coefficient generator, the multibit error detector, and the error correction circuit correct are combinational logic circuits.

13. A method of correcting data errors comprising:
receiving data comprising a plurality of parity bits and generating a plurality of successive odd syndromes;
receiving the plurality of successive odd syndromes and combining the syndromes to produce a plurality of coefficients;
applying the plurality of coefficients to a plurality of digital values, wherein the digital values applied to the plurality of coefficients generate a first bit error vector; and
receiving a first syndrome of the plurality of successive odd syndromes and produce a second bit error vector, wherein an error correction circuit combines the second bit error vector with the data to correct one bit error in the data;
combining the first bit error vector with the data, wherein the first bit error vector is combined with the data to correct one or more bit errors in the data; wherein one of the plurality of coefficients selects between the first bit error vector and the second bit error vector in the error correction circuit.

14. The method of claim 13, further comprising producing a single bit error vector based on a first syndrome, and combining the single bit error vector with the data to correct a one bit error in the data when one of the plurality of coefficients indicates a single bit error.

15. The method of claim 13, wherein each successive odd syndrome is generated from a plurality of alpha values in a finite element field, and wherein the plurality of syndromes comprise:
a first syndrome comprising a plurality of bits generated from XORing corresponding bit positions of the plurality of every alpha value,
a second syndrome comprising a plurality of bits generated from XORing corresponding bit positions of every third alpha value, and
a third syndrome comprising a plurality of bits generated from XORing corresponding bit positions of every fifth alpha value.

16. The method of claim 13, wherein producing a plurality of coefficients comprises:
exponentiating at least a portion of the syndromes to produce a plurality of exponentiated syndromes;
multiplying at least a portion of the syndromes; and
adding one or more of the syndromes, the exponentiated syndromes, and the multiplied syndromes together to produce the plurality of coefficients.

17. The method of claim 16, wherein exponentiating at least a portion of the syndromes generate a square, a cube, a fourth power, and a sixth power of one or more syndromes.

18. The method of claim 13, wherein generating the plurality of successive odd syndromes, producing the plurality of coefficients, generating the first bit error vector, and correcting the one or more bit errors in the data are performed in a single clock cycle using combinational logic circuits.

19. The method of claim 13, wherein the plurality of coefficients, excluding one coefficient, is successively combined with an Nth power of each digital value.

20. The method of claim 19, wherein the N binary alpha values are elements of a finite element field generated from a field generator polynomial.

* * * * *